(12) United States Patent
Juschicz et al.

(10) Patent No.: US 11,456,118 B2
(45) Date of Patent: Sep. 27, 2022

(54) VOLTAGE DIVISION DEVICE HAVING A ROD-LIKE STRUCTURE

(71) Applicant: GREENWOOD-POWER GMBH, Rohrau (AT)

(72) Inventors: Norbert Juschicz, Petronell-Carnuntum (AT); Willibald Bacher, Petronell-Carnuntum (AT)

(73) Assignee: GREENWOOD-POWER GMBH, Rohrau (AT)

( * ) Notice: Subject to any disclaimer, the term of this patent is extended or adjusted under 35 U.S.C. 154(b) by 27 days.

(21) Appl. No.: 15/734,866

(22) PCT Filed: Jul. 3, 2019

(86) PCT No.: PCT/EP2019/067857
§ 371 (c)(1),
(2) Date: Dec. 3, 2020

(87) PCT Pub. No.: WO2020/011620
PCT Pub. Date: Jan. 16, 2020

(65) Prior Publication Data
US 2021/0241975 A1    Aug. 5, 2021

(30) Foreign Application Priority Data

Jul. 11, 2018    (AT) .............................. A 50595/2018

(51) Int. Cl.
*H01G 4/28* (2006.01)
*H01G 4/224* (2006.01)
(Continued)

(52) U.S. Cl.
CPC .............. *H01G 4/28* (2013.01); *G01R 15/04* (2013.01); *G01R 19/0084* (2013.01); *H01G 4/005* (2013.01); *H01G 4/224* (2013.01)

(58) Field of Classification Search
CPC ........ G01R 15/00; G01R 15/04; G01R 15/06; G01R 15/14; G01R 15/16; G01R 19/00;
(Continued)

(56) References Cited

U.S. PATENT DOCUMENTS

2015/0200245 A1   7/2015  Yun et al.
2016/0274149 A1   9/2016  Chatrefou et al.
(Continued)

FOREIGN PATENT DOCUMENTS

CN    201852871 U  *  6/2011
CN    201853571 U     6/2011
(Continued)

OTHER PUBLICATIONS

English Translation of International Search Report (Form PCT/ISA/210) for International Application No. PCT/EP2019/067857 dated Oct. 17, 2019, 2 pages.
(Continued)

*Primary Examiner* — Hoai-An D. Nguyen
(74) *Attorney, Agent, or Firm* — Withrow & Terranova, P.L.L.C.; Vincent K. Gustafson

(57) ABSTRACT

A voltage division device includes a core region with a capacitor arrangement arranged in the core region and an electrical resistor arranged in the core region. A first electrode of the capacitor arrangement has a coupling member for connection with a voltage-carrying element, and a second electrode of the capacitor arrangement has a grounding member for connection with a grounding element. The first electrode and the second electrode are connected in an electrically conductive manner via the electrical resistor. The first electrode and the second electrode include multiple electrically conductive, substantially finger-shaped or rod-shaped modulation elements. arrangement of such a voltage
(Continued)

division device on a connecting part of switchgear of a power grid is further provided.

13 Claims, 1 Drawing Sheet

(51) Int. Cl.
*H01G 4/005* (2006.01)
*G01R 19/00* (2006.01)
*G01R 15/04* (2006.01)

(58) Field of Classification Search
CPC ...... G01R 19/0084; H01G 4/00; H01G 4/002; H01G 4/005; H01G 4/01; H01G 4/224; H01G 4/28; H01G 17/00
USPC .... 324/600, 649, 691, 720, 415, 416, 76.11, 324/98
See application file for complete search history.

(56) References Cited

U.S. PATENT DOCUMENTS

| | | |
|---|---|---|
| 2017/0038414 A1 | 2/2017 | Barba Jimenez |
| 2019/0207209 A1* | 7/2019 | Venkatachalam ..... H01M 4/505 |

FOREIGN PATENT DOCUMENTS

| | | | |
|---|---|---|---|
| CN | 201917593 U | * | 8/2011 |
| CN | 103529262 A | | 1/2014 |
| EP | 0031083 A1 | * | 7/1981 |
| EP | 1306863 A1 | | 5/2003 |
| EP | 3223024 A1 | | 9/2017 |
| JP | H05142264 A | | 6/1993 |
| WO | 9915906 A1 | | 4/1999 |

OTHER PUBLICATIONS

Written Opinion (Form PCT/ISA/237) for International Application No. PCT/EP2019/067857 dated Oct. 17, 2019, 15 pages with English machine translation.

\* cited by examiner

VOLTAGE DIVISION DEVICE HAVING A ROD-LIKE STRUCTURE

This application is a 35 U.S.C. § 371 national phase filing of International Application No. PCT/EP2019/067857 filed on Jul. 3, 2019, and claims the benefit of Austrian Patent Application No. A50595/2018 filed on Jul. 11, 2018, wherein the disclosures of the foregoing applications are hereby incorporated by reference herein in their respective entireties.

The invention relates to a voltage division device according to the preamble of the independent patent claims.

Voltage division devices, also known as voltage dividers, are used for measuring the voltage in switchgear of power grids. By increasingly inputting energy from different types of sources, such as solar energy or wind energy, into power grids, determination and monitoring of certain power parameters of the power grid become increasingly important. This includes the actual line voltage, for example.

In the state of the art, so-called conventional converters are used for measuring. Typically, these are inductive voltage dividers with a ferromagnetic iron core whose susceptibility to interferences is high. As an alternative, so-called unconventional converters are known, which can be substantially divided into the basic technologies of ohmic voltage dividers, ohmic capacitive voltage dividers and capacitive voltage dividers.

Ohmic voltage dividers function with one or more electrical resistors, but suffer from the significant disadvantage that stray capacitances and/or parasitic capacitances coming from the connecting cable or the further structural elements have a big influence on the actual measured value and, hence, the accuracy of the measurement. As an evolution of such ohmic voltage dividers, ohmic capacitive voltage dividers are known, which substantially have at least one electrical resistor and one electrical capacitor with a defined capacitance.

If the capacitance of the capacitor is sufficiently large, the stray capacitances and parasitic capacitances mentioned above become negligibly small and the accuracy of the measurement is increased.

One of the main problems of such ohmic capacitive voltage dividers is that the capacitance of the capacitor should remain as constant as possible over long periods of time—typically several years or even decades—to keep the actual measured value from drifting. Further, the capacitance of the capacitor has to be constant upon changes in the outer temperature or slight changes in the current frequency. In addition, the absorption of moisture into the dielectric located between the capacitor elements may lead to a changing capacitance over the lifespan of the voltage divider.

Typically, the dielectric used in the state of the art is an epoxy casting resin, in which the capacitor elements and the electrical resistor of the voltage divider are cast. The capacitor arrangements of known voltage division devices are designed as two concentrically arranged, circular capacitor elements, for example.

The capacitor elements can become detached from the dielectric upon curing of the casting resin or due to temperature changes so that parts of the capacitor do no longer have a surface in direct contact with the dielectric and cavities are formed. These, in turn, influence the total capacitance of the capacitor.

Furthermore, cavities in the dielectric increase the possibility of partial discharges, which in the end lead to voltage flashovers and, hence, should be avoided.

The object of the present invention is to overcome the drawbacks of the state of the art and to create a voltage division device with a constant capacitance over a long period of time, in particular over several years or decades, and a constant dielectric strength over the entire lifespan of the voltage division device.

The object of the invention is solved by the characterising features of the independent patent claims.

A voltage division device according to the invention comprises a core region with a capacitor arrangement arranged in the core region and an electrical resistor arranged in the core region. A first electrode of the capacitor arrangement comprises a coupling member, wherein a voltage-carrying element can be connected to the voltage division device in an electrically conductive manner via the coupling member. A second electrode of the capacitor arrangement comprises a grounding member, wherein a grounding element can be connected to the voltage division device in an electrically conductive manner via the grounding member. The first electrode and the second electrode are connected in an electrically conductive manner via the electrical resistor.

According to the invention, the first electrode and the second electrode comprise multiple electrically conductive, substantially finger-shaped or rod-shaped modulation elements.

The finger-shaped or rod-shaped design of the modulation elements reduces the possibility of the formation of detachments and, for example, the formation of gas-filled cavities due to shrinking of the dielectric during the manufacturing process of the voltage division device.

Further, the rod-shaped modulation elements can adapt more easily to temperature changes than ring-shaped electrode arrangements. The finger-shaped or rod-shaped modulation elements may substantially "travel along" with the dielectric medium during the manufacturing process and in the case of temperature changes.

Cavities filled with gas increase the possibility of voltage flashovers and prevent the complete discharge of the voltage division device, which is undesirable for a reliable operation. This is particularly important if the capacitor arrangement is embedded in a solid dielectric or if the core region is filled by a solid dielectric. Optionally, a polymer filling the core region may be provided to this end.

It is optionally provided that the modulation elements of the first electrode and the second electrode are arranged in a substantially concentric circular manner with respect to one another.

This enables the largest possible capacitor surface area to be achieved with minimum space requirements. An arrangement in the shape of concentric circles also allows the distance between the capacitor elements to remain constant.

It is optionally provided that the radius of the arrangement of the modulation elements of the external electrode is about 50% larger than the radius of the arrangement of the modulation elements of the internal electrode.

It is optionally provided that the radius of the arrangement of the modulation elements of the internal electrode is between 8 mm and 22 mm and that the radius of the arrangement of the modulation elements of the external electrode is between 15 mm and 40 mm.

If the distance between the modulation elements is big enough, the risk of voltage flashovers between the modulation elements and any damage to the dielectric related thereto can be prevented.

The distance may be adapted in coordination with the operating conditions, in particular in coordination with the input voltage.

It is optionally provided that the modulation elements have a length of 10 mm to 60 mm and that the modulation elements have a diameter of 1.5 mm to 10 mm.

It is optionally provided that the modulation elements have a substantially electrically isolating base body and an electrically conductive coating.

It is optionally provided that the modulation elements comprise an electrically conductive additive and a substantially electrically isolating base mass.

The use of an electrically isolating base body and/or by adding an electrically conductive additive to a substantially electrically isolating base mass allows the expansion coefficients of the dielectric and the modulation elements to be adjusted and moved closer to one another. This further reduced the detachment of the modulation elements and the undesired formation of cavities related thereto. Preferably, an epoxy resin is used as the base body/the base mass. In particular compared to fully metallic modulation elements, this allows the formation of cavities to be greatly reduced.

It is optionally provided that the additive comprises carbon nanoparticles or is made of carbon nanoparticles.

It is optionally provided that the direction of the longitudinal extension of the modulation elements of the first electrode and the direction of the longitudinal extension of the modulation elements of the second electrode extend substantially in parallel.

This allows a substantially continuously constant distance between the modulation elements to be achieved. This may in particular favour a constant capacitance of the capacitor arrangement.

It is optionally provided that the modulation elements of the first electrode and the second electrode have an overlapping area in a direction parallel to the direction of their longitudinal extension. The width of the overlapping area may determine the capacitance of the capacitor arrangement.

It is optionally provided that the first electrode has six to fourteen, preferably eight to twelve, modulation elements and that the second electrode has 14 to 26, preferably 18 to 22, modulation elements.

It is optionally provided that the capacitor arrangement has a capacitance of 1 pF to 30 pF, preferably 1 pF to 15 pF, at a temperature of 20° C., a relative humidity of 50%, a pressure of 1000 mbar and a current frequency of 50 Hz.

If the capacitance of the capacitor arrangement is sufficiently large, stray capacitances and parasitic capacitances can be neglected during the voltage measurement. As a result, the mentioned remaining capacitances become so low compared to the main capacitance of the capacitor that they no longer have a substantial influence on the accuracy of the measurement.

The invention further relates to the arrangement of a voltage division device according to the invention on a connecting part of switchgear of a power grid.

It is optionally provided that the core region comprises a dielectric comprising a siloxane-based polymer or made of a siloxane-based polymer.

Siloxane-based polymers, in particular solid siloxane polymers, also known as silicone polymers, have diffusion-inhibiting characteristics. Such polymers as dielectric are mostly insensitive to water vapour diffusion and the dielectric constant does not change significantly when exposed to air humidity. Further, the frequency transmission behaviour of silicone polymers is better compared to known dielectrics so that standard-compliant requirements, in particular concerning the international standard IEC 60044-7, can be met. Additionally, up to 10 kHz can be transmitted within the predetermined boundaries.

Siloxane-based polymers, in particular solid siloxane polymers, also known as silicone polymers, have elastic characteristics. In a voltage division device according to the invention, this allows the polymer to adapt well to the structure of the electrode arrangement during operation. In the case of inelastic materials, cracks in the material may occur upon temperature changes or the material of the capacitor arrangement may become partially detached from the dielectric. This may lead to a formation of gas-filled cavities, which not only prevent the capacitance of the capacitor arrangement from being constant, but may also lead to voltage flashovers and an incomplete discharge of the voltage division device. These problems may be avoided with a siloxane-based polymer, since a good connection with the elements of the capacitor arrangement is guaranteed.

Optionally, it may be provided that the core region is designed substantially frusto-conically or substantially cylindrically. Optionally, it may be provided that a jacket region, preferably a jacket region of epoxy-based polymer, is provided, which at least partially, preferably completely, surrounds the core region.

Given the typical elastic characteristics of siloxane polymers, it may be advantageous to surround the core region made of siloxane polymer with a mechanically more stable jacket region in order to protect it against deformation and destruction.

Optionally, it may be provided that the dielectric of the core region has a relative dielectric constant of 4 to 6.

Optionally, it may be provided that the relative dielectric constant of the dielectric of the core region changes in a temperature range of −40° C. to 80° C. compared to the relative dielectric constant of the dielectric at 20° C. by a maximum of 3%, preferably by a maximum of 0.75%.

As the voltage division device according to the invention is typically used in non-air-conditioned or heated areas, the dielectric constant of the dielectric is advantageously as constant as possible under normal temperature conditions. This ensures a constant capacitance of the capacitor arrangement, which is advantageous for measuring the voltage as accurately as possible.

Optionally, it may be provided that the relative dielectric constant of the dielectric of the core region changes in a frequency range of 50 Hz to 10000 Hz compared to the relative dielectric constant of the dielectric at 50 Hz by a maximum of 0.6%, preferably by a maximum of 0.4%.

The feed-in of different energy sources can lead to variation in the grid frequency in modern power grids. Therefore, the dielectric constant of the dielectric is advantageously constant also in a frequency range typical for power grids in order to ensure an accurate measurement of the voltage.

Optionally, it may be provided that the relative dielectric constant of the dielectric of the core region at a water content of the dielectric of 5‰ to 30‰ changes by a maximum of 3%, preferably by a maximum of 2.9%, compared to the relative dielectric constant of the dielectric at a water content of 30‰.

Since the voltage division device according to the invention is typically used under normal environmental conditions, it may at times also be exposed to increased air humidity. Typically, siloxane-based polymers have a reduced water absorption capacity. However, the dielectric constant of the dielectric is advantageously as constant as possible over a certain range of the water content in order to achieve constant voltage measurement results also over long periods of time.

In particular, a strong dependency of the dielectric constant on the water content of the dielectric would lead to an undesired drift of the measurement value over time if more and more water diffuses into the dielectric over the operating life of the voltage division device.

Optionally, it may be provided that the core region is cast from a two-component, thermosetting siloxane system.

Optionally, it may be provided that the maximum water absorption capacity is 30%‰ of the weight of the polymer mass at a temperature of 20° C. The maximum water absorption capacity may be determined by storing the silicone polymer in a climatic chamber for about 1000 days, for example.

Optionally, finger-shaped or rod-shaped modulation elements arranged on the first electrode and the second electrode may be provided.

Optionally, the invention further relates to a method for manufacturing a voltage division device according to the invention, comprising the steps of:

Casting the core region from a siloxane-based casting compound, in particular a two-component casting compound, and
curing the core region.

Optionally, the method may comprise the following steps:
Casting the jacket region from a casting compound, in particular an epoxy-based casting compound, and
curing of the jacket region.

Further features of the invention become apparent from the patent claims, the exemplary embodiments and the figures.

In the following, the invention is discussed in detail on the basis of a non-exhaustive exemplary embodiment, wherein.

Figure 1:
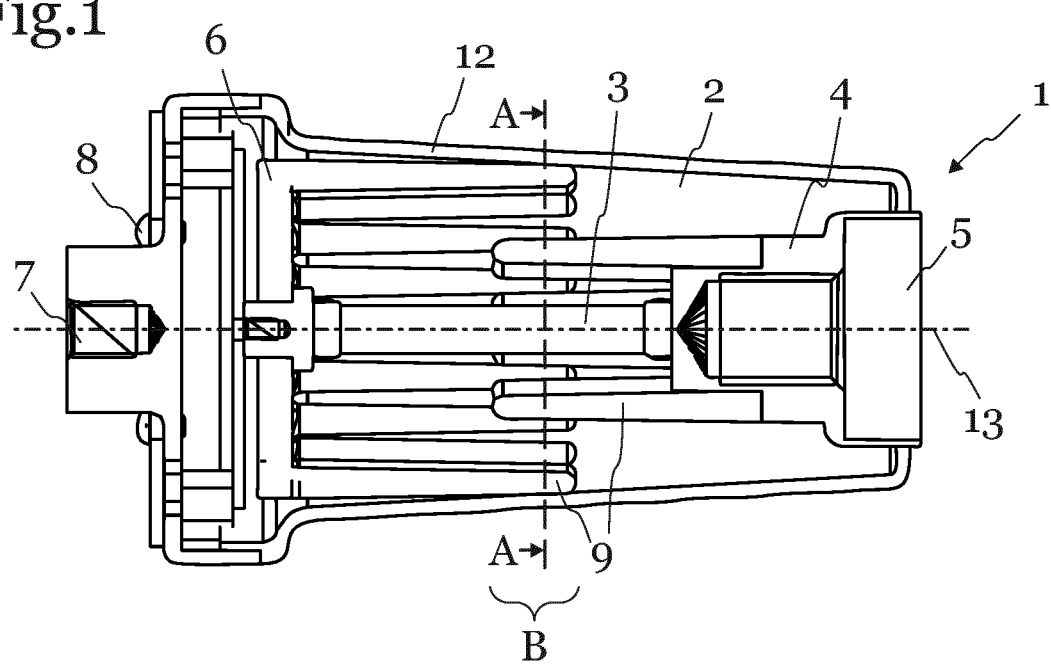
FIG. 1 shows a sectional side view of a voltage division device according to the invention.

FIG. 1 shows a voltage division device 1 according to the invention in a sectional view along a plane extending through a central axis 13 of the voltage division device 1.

The voltage division device 1 comprises a capacitor arrangement, which comprises a first electrode 4 and a second electrode 6. The first electrode 4 is formed integrally with a coupling member 5, which comprises a thread, via which it can be connected to a voltage-carrying element. Optionally, the live element may be a power line in a distribution box of a power grid.

The second electrode 6 is formed integrally with a grounding member 7, which also comprises a thread for attaching a grounding element. Further, the second electrode 6 comprises a measurement terminal 8, via which a measuring instrument for measuring the voltage can be connected. The first electrode 4 and the second electrode 6 have modulation elements 9, which are arranged in concentric circles and are finger-shaped.

In this exemplary embodiment, the finger-shaped modulation elements 9 of the first electrode 4 and the second electrode 6 have substantially parallel directions of their longitudinal extension, wherein the modulation elements 9 of the first electrode 4 and the modulation elements 9 of the second electrode 6 have an overlapping section B.

The first electrode 4 and the second electrode 6 are connected in an electrically conductive manner via an electrical resistor 3.

In this exemplary embodiment, the capacitor arrangement and the resistor 3 are surrounded by a core region 2, which is made of a siloxane-polymer-based elastic material. As the siloxane polymer in this exemplary embodiment is an elastically soft material, the core region 2 in this exemplary embodiment is surrounded by a jacket region 12 made of an epoxy-based polymer in order to increase the mechanical stability.

In this exemplary embodiment, the siloxane polymer has a low water diffusion compared to typically used plastic materials such as epoxy polymers.

Figure 2:
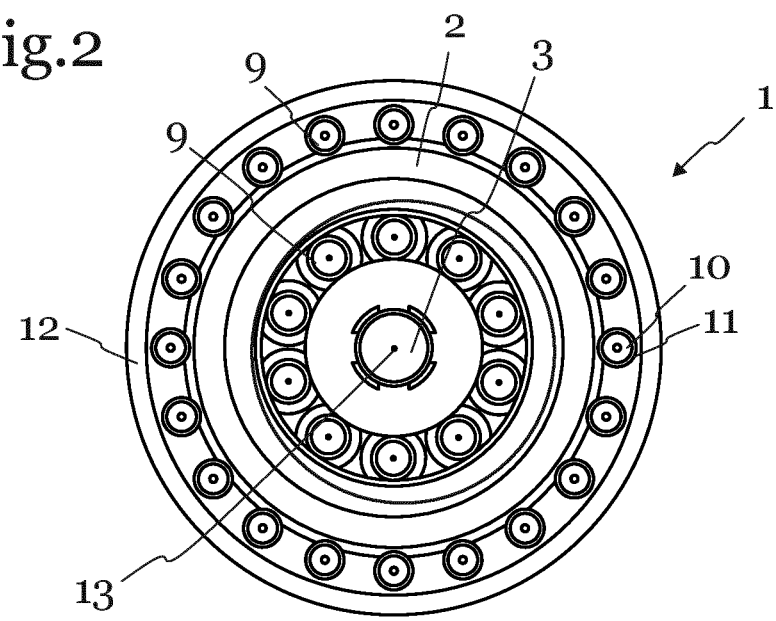
FIG. 2 shows a sectional view of a voltage division device according to the invention along the axis A-A of FIG. 1.

FIG. 2 shows a sectional view of the voltage division device 1 shown in FIG. 1 along the axis A-A. FIG. 2 shows the substantially concentric structure of the elements of the voltage division device 1 according to the invention, in particular of the electrical resistor 3 in the center extending along the central axis 13, as well as the modulation elements 9 of the first electrode 4 in an inner circle and the modulation elements 9 of the second electrode 6 in an outer circle. In this exemplary embodiment, the modulation elements 9 have a substantially electrically isolating base body 10, which is coated with an electrically conductive coating 11, in particular with a conductive varnish, in order to communicate with the first electrode 4/the second electrode 6 in an electrically conductive manner.

In other exemplary embodiments, the modulation elements 9 may also be completely made of an electrically conductive material or an electrical insulator, which is electrically conductive as a result of added additives.

In this exemplary embodiment, the distance between the radii of the two circles, which are described by the arrangement of the modulation elements 9 of the first electrode 4 and the second electrode 6, is about 7.6 mm. In other exemplary embodiments, however, the distance may be different.

The voltage division device 1 described in this exemplary embodiment has a maximum insulation value of 24 kV. In other exemplary embodiments, however, the maximum insulation value may also be 36 kV. Any other maximum insulation values are possible, depending on the area of application.

The voltage division device 1 according to this exemplary embodiment is configured for a nominal voltage of a maximum of $24{,}000/\sqrt{3}$ V at a frequency of 50 Hz. In this exemplary embodiment, the secondary voltage is about $3.25/\sqrt{3}$ V, but may be adapted in other exemplary embodiments, depending on the application.

In this exemplary embodiment, the response factor of the voltage division device, i.e. in particular the capacitance of the capacitor arrangement is constant in a temperature range of −40° C. to 80° C. In particular, the capacitance of the capacitor arrangement in this exemplary embodiment is 8 pF.

LIST OF REFERENCE SIGNS

1 Voltage division device
2 Core region
3 Resistor
4 First electrode
5 Coupling member
6 Second electrode
7 Grounding member
8 Measurement terminal
9 Modulation element
10 Base body
11 Coating 12 Jacket region
13 Central axis
B Overlapping section

The invention claimed is:

1. A voltage division device, comprising:
 a central axis;
 a core region with a capacitor arrangement arranged in the core region, and an electrical resistor arranged in the core region and extending along the central axis;
 a first electrode of the capacitor arrangement with a coupling member for connection with a voltage-carrying element;
 a second electrode of the capacitor arrangement with a grounding member for connection with a grounding element;
 wherein the first electrode and the second electrode are connected in an electrically conductive manner via the electrical resistor,
 wherein the first electrode and the second electrode comprise multiple electrically conductive, finger-shaped or rod-shaped modulation elements; and
 wherein the modulation elements of the first electrode and the modulation elements of the second electrode are arranged in concentric circles with respect to one another and relative to the central axis.

2. The voltage division device according to claim 1, wherein the core region comprises a dielectric comprising a siloxane-based polymer or made of a siloxane-based polymer.

3. The voltage division device according to claim 1, wherein a radius of the arrangement of the modulation elements of the second electrode is 50% larger than a radius of the arrangement of the modulation elements of the first electrode.

4. The voltage division device according to claim 1, wherein a radius of the arrangement of the modulation elements of the first electrode is between 8 mm and 2 mm and in that a radius of the arrangement of the modulation elements of the second electrode is between 15 mm and 40 mm.

5. The voltage division device according to claim 1, wherein the modulation elements have a length of 10 mm to 60 mm and the modulation elements have a diameter of 1.5 mm to 10 mm.

6. The voltage division device according to claim 1, wherein the modulation elements have an electrically isolating base body and an electrically conductive coating.

7. The voltage division device according to claim 1, wherein the modulation elements comprise an electrically conductive additive and an electrically isolating base mass.

8. The voltage division device according to claim 7, wherein the electrically conductive additive comprises carbon nanoparticles or is made of carbon nanoparticles.

9. The voltage division device according to claim 1, wherein a direction of longitudinal extension of the modulation elements of the first electrode is parallel to a direction of longitudinal extension of the modulation elements of the second electrode.

10. The voltage division device according to claim 9, wherein the modulation elements of the first electrode and the second electrode have an overlapping section in a direction parallel to the direction of their longitudinal extension.

11. The voltage division device according to claim 1, wherein the first electrode has six to fourteen modulation elements and the second electrode has 14 to 26 modulation elements.

12. The voltage division device according to claim 1, wherein the capacitor arrangement has a capacitance of 1 pF to 30 pF at a temperature of 20° C., a relative humidity of 50%, a pressure of 1000 mbar, and a power frequency of 50 Hz.

13. An arrangement of a voltage division device according to claim 1 on a connecting part of switchgear of a power grid.

* * * * *